United States Patent Office 3,395,016
Patented July 30, 1968

3,395,016
PHOTOSENSITIVE INSULATION WITH p-XYLENE POLYMERS

William E. Loeb, Martinsville, N.J., assignor to Union Carbide Corporation, a corporation of New York
No Drawing. Filed Dec. 24, 1964, Ser. No. 421,076
10 Claims. (Cl. 96—36)

This invention relates to photosensitive insulation. More particularly, this invention relates to an ultra-thin, polymeric photosensitive insulation which also provides a novel positive photo-masking system exhibiting better resolution and reproduction than heretofore available.

Photo-masking systems are used widely in the manufacture of printed circuits, microcircuits, semi-conductors, precision dies and tools, decorative arts and in other lithographic media. For example, a copper-plated phenolic board to be made into a printed circuit can be first coated with a photosensitive polymer employing conventional methods of application such as dipping, spraying or painting. Then a mask, resembling a photographic negative containing dark and clear portions, is placed over the polymer coating and the composite structure is subjected to irradiation, usually by light from a carbon arc or other similar source. The light, which penetrates the clear areas of the mask, causes a photo-chemical change, usually cross-linking, to occur in the portions of polymer exposed beneath the mask. After a developing step, the unirradiated polymer is dissolved away leaving a replica of the original mask or negative. The exposed surface of the copper can then be etched producing the desired circuit configuration. Finally, the remaining cross-linked polymer is removed by a strong solvent. The photo-masking system described above is conventionally known as a "negative" masking system, i.e., the exposed portions of the polymer become cross-linked; in a "positive" masking system, the exposed portions of the polymer become soluble.

"Positive" masking systems represent an advance over the earlier "negative" masking systems since the unexposed portion constitutes the mask image and the exposed portion can be dissolved away. The positive masking systems thereby enables multiple exposures without the previously existing necessity of applying multiple coatings.

Recently, manufacturers and consumers of photo-masking systems have been seeking better resolution, i.e., the minimum line width or line separation that can be achieved, and better edge definition, i.e., the magnitude of imperfections occurring along a supposedly straight edge. With presently available photo-masking systems, line widths down to about 0.03 mil and tolerances of $\pm 0.01$ mil can be obtained. Various methods have been employed in an attempt to achieve better resolution and line definition, including making the polymer coating as thin as posible. However, photo-masking systems presently available are limited to polymer coatings having thicknesses of about $0.5\mu$ and higher.

Heretofore, photo-masking systems have been limited in use to merely providing a means of image reproduction on various substrates. Once this task has been accomplished, it has been necessary to remove the remaining portions of the masking system before proceeding to obtain the end product. It has long been sought to obtain a photo-masking system through use of a photosensitive material which could simultaneously provide effective insulation on those portions of the substrate surrounding the mask image.

Accordingly, it is an object of the present invention to provide a photosensitive polymeric insulation.

It is another object of this invention to provide an ultra-thin, polymeric photosensitive insulation which also provides a novel photo-masking system exhibiting better resolution and reproduction than heretofore available.

The present invention provides a photosensitive polymeric insulating coating adapted to be applied to an etchable substrate, said coating being comprised of a p-xylylene polymer having the general repeating unit:

$$\left( \text{Ar—CH}_2\text{—CH}_2 \right) \qquad \text{(I)}$$

wherein Ar— represents a divalent benzenoid nucleus as hereinafter defined.

In another aspect, the present invention provides a novel positive photo-masking system comprised of an etchable substrate having a photosensitive coating thereon of a p-xylylene polymer having the general structural formula defined above.

In still another aspect, the present invention provides a method for converting insoluble p-xylylene polymers having the general structure defined above to soluble derivatives thereof by exposing said p-xylylene polymer to ultraviolet light in the presence of oxygen for a sufficient period of time to render said polymer soluble in basic solvent.

Several methods presently exist for applying p-xylylene polymer to substrate surfaces. These polymers can be prepared by the pyrolysis of 1,4-dimethylarylenes such as p-xylene at very high temperatures, e.g., 800°–1000° C. (M. Swarc, Nature, 160, 403 (1947); Faraday Society Discussions 2, 46 (1947); J. Chem. Phys., 16, 128 (1948); and particularly J. Pol. Sci., 6, 319 (1951)). Polymers of this type have also been prepared from p-xylylene dihalides (Jacobson, J. Am. Chem. Soc., 54, 1513 (1932); C. J. Brown and A. C. Farthing, Nature, 164, 915 (1949)). Similar polymers have also been prepared by pyrolysis of p-methylbenzyl quaternary ammonium hydroxides as described by F. S. Fawcett in U.S. Patent 2,757,146. T. E. Young in U.S. Patent 2,999,820 describes still another method of obtaining p-xylylene polymers. This method proceeds through the decomposition of quaternary ammonium compounds such as trimethyl (p-methylbenzyl)-ammonium hydroxide by heating such compounds in aqueous alkali metal hydroxide solutions to temperatures of at least about 100° C.

While the p-xylylene polymers formed by many of the above methods, especially the pyrolytic methods, are significantly cross-linked and highly crystalline in nature, recent developments have enabled the obtainment of truly linear p-xylylene polymers free of cross-linking in commercial yields and efficiencies. In particular, W. F. Gorham in Canadian Patents 637,507 and 638,335 describes the preparation of unsubstituted and ring-substituted p-xylylene polymers and copolymers by the pyrolysis of a cyclic di-p-xylylene having the general structure $$\begin{array}{ccc} \text{H}_2\text{C} & \text{—Ar—} & \text{CH}_2 \\ | & & | \\ \text{H}_2\text{C} & \text{—Ar—} & \text{CH}_2 \end{array} \qquad \text{(II)}$$

wherein Ar— represents a divalent benzenoid nucleus as defined hereinbelow. Pyrolysis occurs at temperatures between about 450° C. and 700° C. at pressures within the range of 0.0001 to 10 mm. Hg.

Inasmuch as the coupling and polymerization of the reactive diradicals formed by the method hereinabove described does not involve the aromatic ring but only the free radical sites, any unsubstituted or substituted p-xylylene polymer can be prepared since the nuclear substituent groups function essentially as inert groups. Thus, the divalent benzenoid nucleus, Ar—, can be any benzene ring substituted or not with any monovalent inorganic or organic groups which can normally be substituted onto an aromatic nucleus.

Notable among the inert substituents that have been substituted on the aromatic nuclei of such p-xylylene polymers other than hydrogen, are the halogens including chlorine, bromine, iodine and fluorine, alkyl groups such as methyl, ethyl, propyl, n-butyl, sec-butyl, tert-butyl, amyl and hexyl, cyano, phenyl, hydroxy, alkoxy, acetoxy, amino, nitro, carboxy, benzyl and other similar groups. While some of the above group are potentially reactive under certain conditions or with certain reactive materials, they are unreactive under the conditions encountered in the present invention and thus are truly inert.

A particular advantage of this vapor-deposition technique is the obtainment of ultra-thin polymeric films of p-xylylene polymers. Continuous films having thicknesses of about 1000 A. and lower have been obtained in this manner. Moreover, p-xylylene polymers obtained in this manner exhibit excellent dielectric properties and are therefore preferred for use as photosensitive insulation. For example, poly-p-xylylene prepared by the Gorham method exhibits the following electrical properties:

(1) Dielectric constant—2.65 from 60 to 100,000 c.p.s.
(2) Dissipation factor—0.0001 from 60 to 100,000 c.p.s.

The above values are relatively constant as compared to other polymers within the temperature range of 4° K. to 175° C.

(3) Dielectric strength (measured on one micron films)—500 volts/micron
(4) Insulation resistance—$10^4$ ohm farads at 25° C.

It has been found in accordance with the present invention that a coating of a p-xylylene polymer applied to an etchable substrate surface by any convenient route such as those described above results in an ultra-thin photosensitive polymeric insulating coating on such substrate thereby providing a photo-masking system wherein the polymeric coating can be applied in thicknesses of 1000 A. or lower. While it is possible to deposit p-xylylene polymers to any desired thickness simply by regulating deposition time, it is of particular advantage in the present invention to deposit ultra-thin films of such polymers, i.e., films having thicknesses less than about 500° Angstroms, thereby providing better resolution and reproduction than heretofore available.

p-Xylylene polymers have heretofore achieved distinction due to their insolubility in all common solvents at room temperature. It has now been found that p-xylylene polymers become completely soluble in dilute basic solutions when exposed to ultraviolet light exhibiting wave lengths in the ultraviolet regions less than about 300 millimicrons and preferably less than about 250 millimicrons, in the presence of substantially stoichiometric proportions of oxygen. It is considered critical that oxygen be present during exposure since p-xylylene polymers are stable to light in the absence of oxygen. Although the exposure time is dependent upon the availability of oxygen, the intensity and placement of the light source employed and the thickness of the polymer coating, it must be for at least a period sufficient to render the polymer completely base-soluble. The proper exposure time can be readily ascertained. It has been found, for example, that about 1 minute of exposure time for every 500 A. thickness of film is sufficient to render the exposed portions completely soluble when a 500 watt high pressure mercury vapor lamp is employed about 7.5 inches from the coated substrate. It is, of course, apparent that the exposure time can be increased or decreased as desired simply by varying the distance of the light source from the substrate or by varying the intensity of the light source itself since exposure time varies directly with the square of the distance of the light source from the substrate and inversely with the intensity of the light source.

While not wishing to be bound by any theory or mechanism, it is believed that upon exposure of the p-xylylene polymers to light in the presence of substantially stoichiometric proportions of oxygen, photo-oxidation occurs leading to chain fracture and the formation of base-soluble aromatic dicarboxylic acids and carboxyl-terminated polymer fragments, as shown by a sample polymer unit as

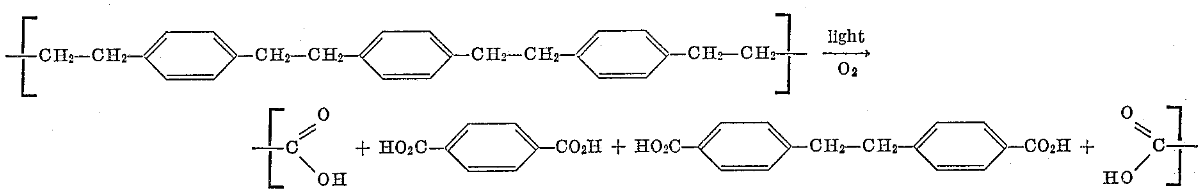

This belief is strengthened by the fact that the exposed portions of the polymer coating are soluble in base. Moreover, acidification of the basic solution results in precipitation of a material which is soluble in dilute sodium bicarbonate with evolution of gas. The precipitate is insoluble in ether and partially soluble in acetone or alcohol. The melting point of the precipitate is over 260° C. These factors are all consistent with the above theory.

The present invention thus provides a method for converting substantially insoluble p-xylylene polymers to soluble derivatives thereof by exposing said polymer to ultraviolet light in the presence of oxygen for a sufficient period of time to render the polymer soluble. Due to the ability of p-xylylene polymers to be converted into a soluble form, a novel positive photo-masking system is thereby provided. Accordingly, it is now possible to selectively etch substrate surfaces and obtain better resolution and reproduction than heretofore attained by applying to an etchable substrate such as metals, as for example, copper, aluminum, glass, quartz, ceramics, semiconductors such as silicon and germanium and the like, an ultra-thin film, i.e., about 5000 A. or lower, of a p-xylylene having the repeating unit $$-\!\!(Ar-CH_2-CH_2)\!\!-$$

wherein Ar— is a divalent benzenoid nucleus. Thereafter, the coated substrate can be masked with a photographic negative or other similar means to selectively expose predetermined portions of the coated substrate. The composite structure is thereupon exposed to ultraviolet light in the presence of oxygen for a period of time sufficient to render soluble the portions of the polymer coating exposed by the mask. The soluble portions of said coated substrate can be dissolved with a dilute base such as sodium hydroxide, potassium hydroxide, sodium carbonate, trisodium phosphate, pyridine, and the like. The choice of base is not critical since any base is suitable; however, the weaker bases such as pyridine act considerably slower. After dissolving the exposed polymer portions, the etchable surface is laid bare in the desired configuration. Due to the excellent resistance to chemical attack of p-xylylene polymers, the coated structure can be dipped directly into a suitable etchant or the etchant can be applied in any other convenient way without fear of destroying the polymeric insulating film barrier.

It has been found that etchants such as nitric acid, concentrated hydrofluoric acid, mixture of hydrofluoric acid with up to 25 percent concentrated nitric acid, aqua regia, and conventional anodizing solutions such as that consisting of ethylene glycol, oxalic acid and water in a volume ratio of 3:1:2, do not destroy the coherent film.

Once the etchable substrate has been etched, the residual polymer coating can be easily removed, if desired, from those portions of the substrate previously unexposed by repeating the above sequence, i.e., exposing said portions to ultraviolet light in the presence of oxygen to render them soluble and thereafter removing the soluble portions by contact with a base. After removing the residual polymer, the substrate is laid bare exhibiting the desired configuration selectively etched therein. It is, however, a primary advantage of the present invention to allow the residual polymer coating to remain intact on the etched substrate and thereby provide insulation about the desired configuration etched in said substrate.

The present invention is further illustrated by the following examples. These examples are merely illustrative and are not to be construed in derogation of the spirit or scope of the present invention. Unless otherwise specified all parts and percentages are by weight.

EXAMPLE 1

101.5 milligrams of di-p-xylylene was placed within a boro-silicate glass sublimation chamber measuring 2 inches in diameter and 4 inches long. A thermocouple gauge registered the pressure at one end of the chamber, the other end of said chamber being connected by a standard taper joint to a 1⅜ inch diameter quartz pyrolysis tube 26 inches long. The di-p-xylylene was sublimed at an outside temperature of about 150° C. and a pressure of about 0.2 mm. Hg. The vapors passed through a 6 inch section of the pyrolysis tube (vaporization zone) heated to 200° C. and then through a 19 inch length (pyrolysis zone) maintained at temperatures of about 665° C. Connected to the terminal portion of the pyrolysis tube via a 5 inch long flanged dome was a deposition chamber 3 inches in diameter and 15 inches long. Excess vapors were condensed in a Dry Ice-acetone trap. A 13 c.f.m. vacuum pump maintained the pressure between about 5 and 120 microns Hg. Quartz slides which had been cleaned with dilute ammonium hydroxide were placed in the deposition zone.

The di-p-xylylene sublimed and was pyrolyzed to form p-xylylene diradicals which condensed and polymerized in the deposition zone which was maintained at room temperature to form a coating of poly(p-xylylene) on the quartz slides. The pressure rose from 7 to 118 microns during the run which lasted 13 minutes. The thickness of the polymer coating on the quartz slides was between 0.28 to 0.38 micron as determined by weighing the slides before and after coating.

The coated slides were partially masked with aluminum foil and exposed 1½ inches away from a 140 watt high pressure mercury vapor lamp for between about five to ten minutes. The exposed portions of the film were completely and rapidly soluble in cold, 2 percent aqueous sodium hydroxide solution.

EXAMPLE 2

Quartz slides were coated with poly(p-xylylene) using the apparatus and method described in Example 1. Coating thickness was varied from about 0.4 to 3.0 microns. The coated slides were exposed to a 550 watt high pressure mercury vapor lamp spaced 7½ inches away from said slides. Exposure time was about 0.05 micron per minute, i.e., a one micron film required about 20 minutes to become completely soluble in basic solution.

Ultraviolet analysis of the unexposed polymer indicated intense peaks at 205 and 232 millimicrons plus minor peaks at 257, 265 and 275 millimicrons indicating that exposure is limited to ultraviolet light. Exposure to visible light, i.e., 400 to 800 millimicrons would not render the polymeric film soluble.

EXAMPLE 3

Glass slides were coated using the apparatus and method employed in Example 1 except that dichloro-di-p-xylylene having the formula

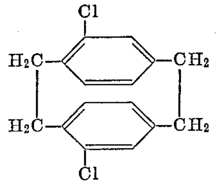

was pyrolyzed to form poly(2-chloro-p-xylylene). Coating thicknesses as determined by weight measurements varied from about 0.2 to 2.4 microns. The coated slides were exposed to the ultraviolet rays of a 550 watt high pressure mercury vapor lamp spaced a distance of 7½ inches from the slides for a period of about 0.05 micron per minute rendering the film completely soluble.

The present invention is particularly useful in electronic applications since poly(p-xylylene) is an excellent dielectric insulation material as shown hereinabove. For example, a typical application is the manufacture of microminiature circuits wherein insulation is desired in certain areas and electrical contact is desired in others. At the desired stage of fabrication the substrate material such as copper-plated phenolic boards, silicon slices and the like can be coated with poly(p-xylylene) by any of the methods described hereinabove. A mask containing the desired circuit configuration could then be placed over the substrate and the composite structure exposed to ultraviolet light in the presence of oxygen for a sufficient period of time to render the exposed portions of the polymer film soluble. The portions of the poly(p-xylylene) film beneath the transparent portions of the mask would photo-oxidize and become completely and rapidly soluble in basic solution. This would enable the insulation to be removed in the desired areas and allow electrical contact to be made. Also, due to the chemical inertness of the poly(p-xylylene) film subsequent etching operations could be included without fear of destroying the protective insulating film barrier.

What is claimed is:

1. Method for converting substantially insoluble, p-xylylene polymers having the repeating unit:

$$\text{-(}Ar—CH_2—CH_2\text{)-}$$

wherein Ar— is a divalent benzenoid nucleus, to soluble derivatives thereof which comprises exposing said polymer to ultraviolet light in the presence of oxygen.

2. Method as defined in claim 1 wherein the source of light exhibits wave lengths in the ultraviolet regions less than about 300 millimicrons.

3. Method as defined in claim 1 wherein oxygen is present during exposure in substantially stoichiometric proportions.

4. Method for converting substantially insoluble p-xylylene polymers having the repeating unit $$\text{-(}Ar—CH_2—CH_2\text{)-}$$

wherein Ar— is a divalent benzenoid nucleus, to base soluble derivatives thereof which comprises exposing said polymer to light exhibiting wave lengths in the ultraviolet regions less than about 250 millimicrons in the presence of substantially stoichiometric proportions of oxygen.

5. Method for selectively etching substrate surfaces which comprises:

(a) masking an etchable substrate coated with a p-xylylene polymer having the repeating unit:

$$\text{-(}Ar—CH_2—CH_2\text{)-}$$

wherein Ar— is a divalent benzenoid nucleus, to selectively expose predetermined portions of said substrate;

(b) exposing the composite structure to ultraviolet light in the presence of oxygen for a sufficient period of time to render soluble the exposed portions of said p-xylylene polymer on said substrate; and thereafter (c) dissolving the soluble portions of said p-xylylene polymer from said substrate.

6. Method as defined in claim 5 wherein the source of light exhibits wave lengths in the ultraviolet regions less than about 300 millimicrons.

7. Method as defined in claim 5 wherein oxygen is present during exposure in substantially stoichiometric proportions.

8. Method for selectively etching substrate surfaces which comprises:

(a) masking an etchable substrate coated with a p-xylylene polymer having the repeating unit:

$$\left( Ar—CH_2—CH_2 \right)$$

wherein Ar— is a divalent benzenoid nucleus, to selectively expose predetermined portions of said substrate;

(b) exposing the composite structure to ultraviolet light in the presence of oxygen for a sufficient period of time to render soluble the exposed portions of said p-xylylene polymer on said substrate;

(c) dissolving the soluble portions of said p-xylylene polymer from said substrate; and thereafter, (d) etching the exposed substrate with a suitable etchant.

9. Method as defined in claim 8 wherein the residual polymeric insulating coating is removed from those portions of the substrate previously unexposed by repeating steps (b) and (c) of said claim 8.

10. Photo-masking system comprised of an etchable substrate having a photosensitive insulating coating thereon of a p-xylylene polymer having the repeating unit:

$$\left( Ar—CH_2—CH_2 \right)$$

wherein Ar— is a divalent benzenoid nucleus.

References Cited

UNITED STATES PATENTS

| | | | |
|---|---|---|---|
| 2,892,712 | 6/1959 | Plambeck | 96—35 |
| 2,914,489 | 11/1959 | Hall | 260—2 |
| 3,294,531 | 12/1966 | Schlesinger | 260—2 X |

OTHER REFERENCES

The Chemical Age, January 1955, "Degradation of Plastics," pp. 149–153.

NORMAN G. TORCHIN, *Primary Examiner.*

R. MARTIN, *Assistant Examiner.*